United States Patent [19]

Uemura et al.

[11] Patent Number: 4,733,204

[45] Date of Patent: Mar. 22, 1988

[54] ULTRASONIC-WAVE DELAY ELEMENT

[75] Inventors: Michihiko Uemura; Naomitsu Umemura; Tunaomi Fukui, all of Yokohama, Japan

[73] Assignee: Asahi Glass Company Ltd., Tokyo, Japan

[21] Appl. No.: 843,381

[22] Filed: Mar. 24, 1986

[30] Foreign Application Priority Data

Mar. 28, 1985 [JP] Japan .................. 60-43926[U]
Mar. 28, 1985 [JP] Japan .................. 60-43927[U]

[51] Int. Cl.$^4$ .................................... H03H 9/36
[52] U.S. Cl. .................... 333/143; 333/142; 310/326
[58] Field of Search .......... 333/141, 1, 149, 187, 333/186; 310/326

[56] References Cited

FOREIGN PATENT DOCUMENTS

| 0142616 | 8/1983 | Japan | 333/141 |
| 0218029 | 12/1984 | Japan | 333/142 |
| 0114013 | 6/1985 | Japan | 333/143 |
| 0200607 | 10/1985 | Japan | 333/141 |
| 0254812 | 12/1985 | Japan | 333/141 |

Primary Examiner—Eugene R. Laroche
Assistant Examiner—Seung Ham
Attorney, Agent, or Firm—Oblon, Fisher, Spivak, McClelland & Maier

[57] ABSTRACT

An ultrasonic-wave delay line element comprises a pentagonal delay medium body formed by cutting at an angle of about 45° a part of the major surface defined by a rectangular shape having two longer sides and two shorter sides, and has a pair of input and output electric-mechanic transducers provided on a side A formed by cutting the major surface. The input and output electric-mechanic transducers are attached to the cut side A at positions near longer side C contiguous to the cut side A with respect to the center of the cut side A; a reflection point for a sound-wave is provided in the cut side A while no reflection point is provided in a shorter side B contiguous to the out side A; two or more reflection points are provided in the longer side C; two reflection points are formed in the other shorter side D isolated from the cut side A; and four or more reflection points are provided in the other longer side E isolated from the cut side A.

6 Claims, 5 Drawing Figures

ULTRASONIC-WAVE DELAY ELEMENT

BACKGROUND OF THE INVENTION

1. Field of the Invention

The present invention relates to an ultrasonic-wave delay element. More particularly, it relates to such element suitably used for a video tape recorder, a video camera and so on.

2. Description of the Prior Art

There has been known an ultrasonic-wave delay element as shown in FIG. 4. In the side view of FIG. 4, a part of a delay medium body 1 made of a material such as glass and having the major surface defined by a rectangular shape is cut at an angle of about 45°, and an input electric-mechanic transducer 2 and an output electric-mechanic transducer 3 (herein below referred to as simply a transducer) are provided in the side A formed by cutting the part of the delay medium body 1. In the ultrasonic-wave delay element of this type, for the purpose of miniaturization of the element, it is usual to design a sound-wave path in such a manner that a single reflection point (a) exists in the cut side A so that the direction of incident of the sound-wave is substantially equal to the direction of reflection of it.

There has also been known an ultrasonic-wave delay element in which a pentagonal delay medium body 1 formed by cutting at an angle of about 45° a part of the major surface defined by a rectangular shape is used, and an ultrasonic-wave propagation path 8' is always in parallel with and perpendicular to the reflected ultrasonic-wave propagation path 8'' as shown in FIG. 5 (Japanese Examined Utility Model Publication No. 117/1978).

In the ultrasonic-wave delay element of this type as shown in FIG. 4, the size of the delay medium body 1 can be miniaturized by providing a single reflection point (a) for a sound-wave in the cut side A. It is, however, insufficient for the purpose of miniaturization because of recent demand of reduction in weight and size of a video tape recorder and a video camera, and there is demand of further miniaturization for the ultrasonic-wave delay element.

In the ultrasonic-wave delay element as shown in FIG. 5, there is limitation in miniaturization because it is necessary to determine an ultrasonic-wave propagation path in parallel and vertical to the reflected propagation path.

Generally, the conventional ultrasonic-wave delay element is provided with lead wires which are attached to electrodes (not shown in the drawing) provided on the input and output transducers by, for instance, soldering so that a voltage is applied to the input transducer and a voltage is taken out from the output transducer. However, since the input and output transducers emit sound-waves at the opposite side of the delay medium body to carry out electric-mechanical transducing or mechanical-electrical transducing (herein below referred to as simply electric-mechanical transducing), there takes place irregular reflection of the sound-waves at the lead-wire fitting parts 4, 5 in FIGS. 4 and 5. When the sound-waves regularly reflected are input in the delay medium body through the input and output transducers, the sound-waves being propagated to the output transducer after they have been reflected on a side surface of the delay medium body, the sound-waves are detected as spurious signals (which are indicated by the reference numerals 6 and 7 in FIGS. 4 and 5).

Particularly, when the size of the delay medium body is miniaturized as the above-mentioned ultrasonic-wave delay element, the size of the input and output transducers should also be small, whereby an angle of expansion of the sound-wave becomes large and the positions of the input and output transducers come close with the result that influence by the spurious signals becomes large. For instance, when the ultrasonic-wave delay element having the above-mentioned construction is used for a comb filter circuit or a noise canceller of the video tape recorder, noises in a vertical strip form occur in a reproduced image due to the spurious signals.

If the size of the delay medium body is enlarged, the magnitude of the sprious signals becomes small. On the contrary, however, the size of the ultrasonic-wave delay element becomes as a whole large. This is contradictory to the recent demand of reduction in weight and size.

SUMMARY OF THE INVENTION

It is an object of the present invention to provide an ultrasonic-wave delay element of light weight and small-sized.

It is another object of the present invention to provide an ultrasonic-wave delay element having excellent spurious characteristics.

According to the present invention, there is provided an ultrasonic-wave delay element comprising a pentagonal delay medium body formed by cutting at an angle of about 45° a pair of the major surface defined by a rectangular shape and a part of input and output electric-mechanic transducers provided on a side formed by cutting the major surface, characterized in that the input and output electric-mechanic transducers are attached to the cut side A at positions near a longer side C contiguous to the cut side A with respect to the center of the cut side A; a reflection point for a sound-wave is provided in the cut side A while no reflection point is provided in a shorter side B contiguous to the cut side A; two or more reflection points are provided in the longer side C; two reflection points are formed in the other shorter side D isolated from the cut side A; and four or more reflection points are provided in the other longer side E isolated from the cut side A.

According to another aspect of the present invention, there is provided an ultrasonic-wave delay element in which at least one sound-absorbing substance is attached to the major surface of the delay medium body so that the a sound-wave path is formed from a lead-wire fitting part of the input or output electric-mechanic transducer to the output or input electric-mechanic transducer while the sound-wave is once reflected at a longer side E, in addition to the features as described above.

BRIEF DESCRIPTION OF THE DRAWINGS

A more complete appriciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
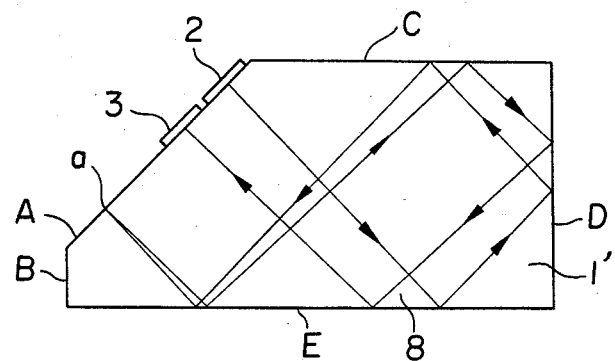
FIG. 1 is a side view showing a first embodiment of the ultrasonic-wave delay element of the present invention.

An embodiment of the present invention will be described with reference to FIG. 1.

Figure 4:
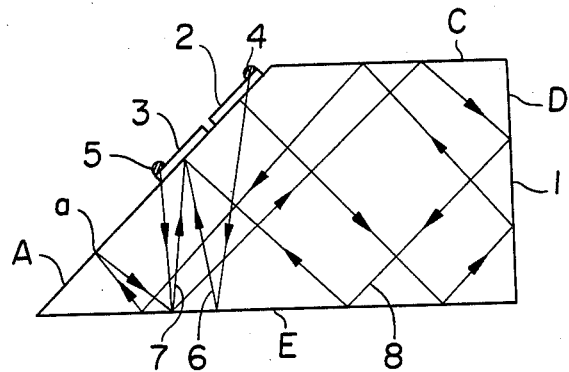
FIG. 4 is a side view showing a conventional ultrasonic-wave delay element.

A delay medium body 1' which is of a material such as isotropic glass, ceramics, metal and so on capable of propagating a sound-wave, is formed in a pentagonal shape by cutting at an angle of about 45° a part of the major surface defined by a rectangular shape. With such pentagonal major surface, the length of a longer side E which is not contiguous to a side A formed by cutting the major surface having a rectangular shape can be small, whereby the size of the delay medium body is made smaller than the conventional delay medium body 1 as shown in FIG. 4.

The input and output transducers 2, 3 are attached to the cut side A through respective electrodes (not shown) by a method such as bonding by an adhesive agent, soldering and so on at positions near a longer side C with respect to the center of the cut side A, the input and output transducers being made of a material such as lead zirconate titanate, quartz, lithium niobate and so on. Thus, by attaching the input and output transducers 2, 3 on the cut side A at positions near the longer side C with respect to the center of the cut side A, a reflection point (a) in a path 8 for a sound-wave signal can be determined in the cut side A at the position near the longer side C in contrast to the convetional delay medium body as shown in FIG. 4. Accordingly, there is obtainable the pentagonal delay medium body 1' having a shorter side B which is contiguous to the cut side A and has no reflection point, whereby it is possible to miniaturize the delay medium body 1'.

In the determination of the dimension of the delay medium body 1', it is desirable that the length of the shorter side B is in the range from 1/6 to 1/4 of the other shorter side D which is isolated from the cut side A. This is because when the length of the shorter side B is shorter than one sixth of the length of the shorter side D, effect of miniaturization of the delay medium body is insufficient. On the other hand, when it is longer than one fourth of the shorter side D, a sufficient width of the input and output transducers 2, 3 can not be obtained to thereby deteriorate electric-mechanical transducing efficiency. When the ultrasonic-wave delay element is used in a circuit of the video tape recorder and so on, insertion loss increases and frequency band characteristics become poor.

Figure 5:
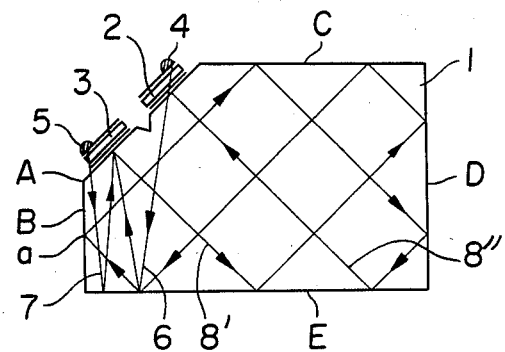
FIG. 5 is a side view showing another conventional ultrasonic-wave delay element.

Determination of the path 8 for the sound-wave signal depends on the shape of the delay medium body 1' and the positions of the input and output transducers 2, 3. It is preferable that a single reflection point (a) is provided on the cut side A at a position that the direction of incident of a sound-wave is close to the direction of reflection of the sound-wave, while there is no reflection point on the shorter side B contiguous to the cut side A; two or more reflection point are provided on the longer side C contiguous to the cut side A; two reflection points are provided on the shorter side D isolated from the cut side A; and four or more reflection points are provided on the longer side E isolated from the cut side A. By designing the ultrasonic-wave propagation path 8 in such manner, the path 8 formed by several times of reflection in the delay medium body 1' does not take passage ways in parallel with and vertical to each other, whereby the shape of the delay medium body 1' can be sufficiently small in contrast with the conventional delay medium body as shown in FIG. 5.

When the ultrasonic-wave delay element is used for the comb filter circuit or the noise canceller circuit, it is preferable that the path 8 for the sound-wave signal is so designed that the longer side C contiguous to the cut side A has two reflection points, and the longer side E isolated from the cut side A has four reflection points. This is because when the path 8 for the sound-wave signal is so designed that the longer sides C, E respectively have the number of reflection points more than the above-mentioned, attenuation of a normal sound-wave singnal becomes large and influence by the spurious signal becomes large. On the other hand, in the small-sized pentagonal delay medium body 1', it is difficult to form the path 8 for sound-wave signal at the number of reflection smaller than the above-mentioned. Of course, the above-mentioned discussion applys only to the case that the ultrasonic-wave delay element is utilized for the comb filter circuit or the noise canceller circuit for the video tape recorder. Accordingly, if requisite delay time is changed, then, naturally the number of reflection in the signal path changes.

As described above, the ultrasonic-wave delay element of this embodiment is so constructed that the pentagonal delay medium body formed by cutting at an angle of about 45° a part of the major surface defied by a rectangular shape is used, and the input and output transducers are provided on the cut side at positions near the longer side C with respect to the center of the cut side. Accordingly, design can be made in such a manner that a reflection point is provided on the cut side A while there is no reflection point on the shorter side B contiguous to the cut side A; the longer side C contiguous to the cut side A has two or more reflection points; the shorter side D isolated from the cut side A has two reflection points; and the longer side E isolated from the cut side A has four or more reflection points; and the reflection point on the cut side A is determined at a position near the longer side C whereby the delay medium body can be miniaturized.

Figure 2:
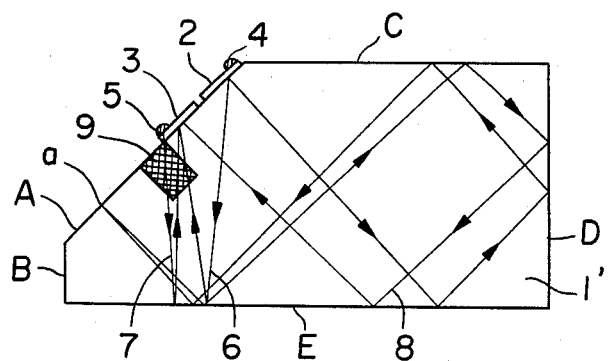
FIG. 2 is a side view showing a second embodiment of the present invention.

FIG. 2 is a side view showing a second embodiment of the present invention. In FIG. 2, the same reference numerals as in FIG. 1 designate the same structural elements and therefore, description of these elements is omitted.

In the second embodiment, it is preferable that the length of the shorter side B is in the range from 1/6 to 1/4 of the other shorter side D which is isolated from the cut side A. It is because when the length of the shorter side B is shorter than one sixth of the length of the shorter side D, a sufficient space for a sound-absorbing substance 9 is not obtained and the advantage of miniaturization of the delay medium body 1' is insufficient, the sound-absorbing substance being to attenuate spurious signals 6, 7 generated from the lead-wire fitting parts 4, 5 which are attached to electrodes (not shown) provided on the input and output transducers 2, 3. On the contrary, when the length of the shorter side B is greater than one fourth of the shorter side D, the input and output transducers 2, 3 can not have sufficient widths as described with reference to the embodiment shown in FIG. 1, whereby electric-mechanic transducing efficiency becomes low. When the ultrasonic-wave delay element having the above-mentioned delay medium body is used for a circuit of the video tape recorder, insertion loss increases and band characteristics become poor.

The input transducer 2 is provided on the outer surface with an electrode (not shown) and a lead-wire fitting part 4 is formed on a part of the electrode by connecting a lead wire (not shown) for applying a voltage to the input transducer 2 by a method such as soldering. On the other hand, a lead-wire fitting part 5 is formed on a part of electrode provided on the surface of the output transducer 3 by connecting a lead wire (not shown) for taking out an output electric signal by a method such as soldering.

As described above, there takes place irregular reflection of sound-waves from the input and output transducers 2,3 at the lead-wire fitting parts 4, 5. Some part of the irregularly reflected sound-waves enter into the delay medium body 1' through the input and output transducers 2, 3, and the some part of the sound-waves entering in the delay medium body 1' is detected as spurious signals by the output transducer 3. The spurious signals take various paths in the delay medium body 1'. Of the various spurious signals, spurious signals 6, 7 which reach the output transducer 3 from the lead-wire fitting parts 4, 5 of the input and output transducers 2, 3 after they are once reflected at the longer side E isolated from the cut side, are most difficult to reduce their signal levels. In the second embodiment, a sound-absorbing substance 9 made of a material such as rubber, nylon, vinyl or epoxy resin, polycarbonate resin, cellulose acetate and so on and having ultrasonic-wave attenuating characteristics is attached on the major surface of the delay medium body 1' providing passages for the spurious signals 6, 7, by a method such as printing.

Figure 3:
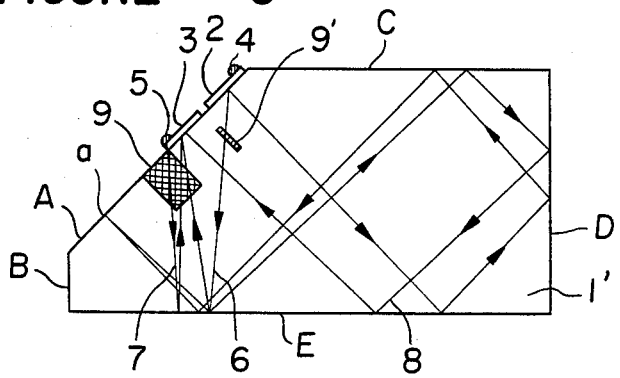
FIG. 3 is a side view showing a third embodiment of the present invention.

The sound-absorbing subtance 9 may be provided at only one position as in the second embodiment, however, an additional sound-absorbing substance may be placed at a position in the major surface of the delay medium body 1' which causes the sound-wave to pass from the lead-wire fitting parts 4, 5 to the output transducer 3 after the sound-wave has been once reflected at the longer side E isolated from the cut side A, specifically, it may be placed at a position as indicated by a reference numeral 9' in FIG. 3. Thus, by providing the sound-absorbing substance at plural positions, the spurious signals can certainly be attenuated.

The spurious signals reflected at the lead-wire fitting parts 4, 5 to enter into the input transducer 2 through the delay medium body 1' are again returned to the delay medium body 1' from the input transducer 2 as sound-waves overwrapping an input electric signal. The spurious signals overwrapping the input electric signals are passed through the normal signal path 8 to be detected by the output transducer 3. Accordingly, the spurious signals can be sufficiently attenuated by providing at least one sound-absorbing substance in the major surface of the delay medium body 1' which provides the sound-wave path starting from the lead-wire fitting parts 4, 5 and reaching the input transducer 2 in which the sound-wave signal is once reflected at the longer side E isolated from the cut side A.

In the second embodiment, at least one sound-absorbing substance is provided in the major surface of the delay medium body which provides the sound-wave path starting from the lead-wire fitting parts of the input and output transducers, followed by one time of reflection at the longer side E isolated from the cut side A and reaching the output or input transducer. Accordingly, of the spurious signals entering in the delay medium body from the lead-wire fitting parts, the spurious signals as a factor of deteriorating an S/N ratio of the ultrasonic-wave delay element can be sufficiently attenuated thereby contributing improvement in the S/N ratio.

EXAMPLE 1

A rectangular prism having a longer side E of 3.5 cm, a shorter side D of 1.7 cm and a thickness of 0.1 cm made of glass was prepared. A part of the rectangular prism was cut at an angle of 45° to form a delay medium body having a pentagonal major surface in which the length of a cut side A is 1.9 cm, the length of a shorter side B contiguous to the cut side A is 0.4 cm and the length of a longer side C is 2.1 cm.

Two piezo-electric material made of lead zirconate titanate series and having a length of 0.4 cm and a thickness of 0.03 cm were attached onto the cut side A of the delay medium body through respective electrodes by an adhesive agent at upper positions with respect to the center of the cut side A thereby forming an input transducer and on output transducer. Lead-wire fitting parts are formed by soldering lead wires on the outer surface of the input and output transducers.

In the ultrasonic-wave delay element thus produced, the surface area of the major surface could be reduced in surface ratio to about 0.2 cm$^2$ or about 1.5 cm$^2$ in comparison with the conventional ultrasonic-wave delay element as shown in FIG. 4 or 5, assuming that the element has the same delay time.

EXAMPLE 2

An ultrasonic-wave delay element was prepared in the same manner as Example 1 except that a sound-absorbing substance made of epoxy resin is attached to the delay medium body by a printing method as shown in FIG. 2, the sound-absorbing substance being provided in a sound-wave path starting from the lead-wire fitting parts of the input and the output transducers followed by one time of reflection at the longer side E and reaching the output transducer.

In the ultrasonic-wave delay element with the sound-absorbing substance, the spurious signals generated from the lead-wire fitting parts can be reduced further 5 dB in comparison with the ultrasonic-wave delay element having no sound-absorbing substance.

EXAMPLE 3

An additional sound-absorbing substance 9' is provided in the major surface of the ultrasonic-wave delay element prepared in accordance with Example 1 at a position as shown in FIG. 3. Provision of the sound-absorbing substance 9' reduces the spurious signals further 3 dB in comparison with the ultrasonic-wave delay element of Example 1.

In accordance with the ultrasonic-wave delay element of the present invention, the input and the output transducers are provided on the cut side A of the delay medium body having a pentagonal major surface which is formed by cutting at an angle of about 45° a part of rectangular delay medium body, the transducers being placed at positions near the longer side C with respect to the center of the cut surface A. Accordingly, the delay medium body can be miniaturized; it can be preferably used for the ultrasonic-wave delay element for a video tape recorder and a video camera which are required to be small-sized and to have high quality.

According to the present invention, at least one sound-absorbing substance is provided in the major surface of the delay medium body which provides a sound-wave path starting from the lead-wire fitting parts of the input and output transducers followed by one time of reflection at the longer side E and reaching the output or input transducer. Accordingly, the disadvantage caused by spurious signals can be removed and it can be used as an ultrasonic-wave delay element for the video tape recorder and video camera which are required to be smell-sized and to have high quality.

What is claimed is:

1. An ultrasonic-wave delay element comprising:
   pentagonal delay medium body formed by cutting at an angle of about 45° a part of the major surface defined by a rectangular shape and a pair of input and output electro-mechanical transducers provided on a side A formed by cutting said major surface, wherein said input and output electro-mechanical transducers are positioned and attached to said cut side A at positions near a longer side C contiguous to said cut side A with respect to the center of the cut side A;
   such that upon activation of one of said transducers a wave is produced which has a reflection point for said wave in said cut side A with no reflection occurring on a shorter side B which is contiguous to said cut side A;
   wherein said wave reflects at two or more reflection points on said longer side C;
   further wherein said wave reflects at two reflection points on the other shorter side D which is isolated from said cut side A; and
   wherein said wave reflects at four or more reflection points on the other longer side E which is isolated from said cut side A.

2. An ultrasonic-wave delay element according to claim 1, wherein said wave reflects on said longer side C which is contiguous to said cut side A at two reflection points and wherein said wave reflects on said longer side E which is isolated from said cut side A has a four reflection points.

3. An ultrasonic-wave delay element according to claim 1, wherein the length of said shorter side B contiguous to said cut side A is in the range from 1/6 to ¼ of said shorter side D isolated from said cut side A.

4. An ultrasonic-wave delay element comprising:
   a pentagonal delay medium body formed by cutting at an angle of about 45° a part of the major surface defined by a rectangular shape and a pair of input and output electro-mechanical transducers provided on a side A formed by cutting said major surface wherein said input and output electro-mechanical transducers are positioned and attached to said cut side A at positions near a longer side C contiguous to said cut side A with respect to the center of the cut side A;
   such that upon activation of one of said transducers a wave is produced which has a reflection point for said cut side A with no reflection point occurring in a shorter side B which is contiguous to said cut side A;
   wherein said wave reflects at two or more reflection points on said longer side C;
   further wherein said wave reflects at two reflection points are formed in the other shorter side D which is isolated from said cut side A; and wherein said wave reflects at four or more reflection points on the other longer side E isolated from said cut side A; and at least one sound-absorbing substance is attached to the major surface of said delay medium body so that a path for a sound-wave initiates from the lead-wire fitting part of said input or output electric-mechanic transducer to said output or input electric-mechanic transducer while the sound-wave is once reflected at said longer side E.

5. An ultrasonic-wave delay element according to claim 4, wherein said wave reflects on said longer side C which is contiguous to said cut side A at two reflection points and wherein said wave reflects on said longer side E which is isolated from said cut side A at four reflection points.

6. An ultrasonic-wave delay element according to claim 4, wherein the length of said shorter side C contiguous to said cut side A is in the range from 1/6 to ¼ of said shorter side D isolated from said cut side A.

* * * * *